US011171242B2

(12) United States Patent
Kawaguchi et al.

(10) Patent No.: US 11,171,242 B2
(45) Date of Patent: Nov. 9, 2021

(54) SEMICONDUCTOR DEVICE AND METHOD FOR MANUFACTURING SEMICONDUCTOR DEVICE

(71) Applicant: FUJITSU LIMITED, Kawasaki (JP)

(72) Inventors: Kenichi Kawaguchi, Ebina (JP); Naoya Okamoto, Isehara (JP); Yusuke Kumazaki, Atsugi (JP); Tsuyoshi Takahashi, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/944,209

(22) Filed: Jul. 31, 2020

(65) Prior Publication Data

US 2020/0365741 A1    Nov. 19, 2020

Related U.S. Application Data

(63) Continuation of application No. PCT/JP2018/009402, filed on Mar. 12, 2018.

(51) Int. Cl.
*H01L 29/786* (2006.01)
*H01L 29/06* (2006.01)
(Continued)

(52) U.S. Cl.
CPC .... *H01L 29/78642* (2013.01); *H01L 21/0262* (2013.01); *H01L 21/02546* (2013.01); *H01L 21/02603* (2013.01); *H01L 21/28264* (2013.01); *H01L 21/28575* (2013.01); *H01L 29/0676* (2013.01); *H01L 29/41733* (2013.01);
(Continued)

(58) Field of Classification Search
CPC ........... H01L 29/78642; H01L 29/0676; H01L 29/41733; H01L 29/42392; H01L 29/66522; H01L 29/66742; H01L 29/78681; H01L 1121/02546;
(Continued)

(56) References Cited

U.S. PATENT DOCUMENTS

2008/0042120 A1    2/2008   Shibata et al.
2010/0176459 A1    7/2010   Wernersson et al.
(Continued)

FOREIGN PATENT DOCUMENTS

JP      2007-317961 A    12/2007
JP      2009-212551 A     9/2009
(Continued)

OTHER PUBLICATIONS

Karl-Magnus Persson et al, "Extrinsic and Intrinsic Performance of Vertical InAs Nanowire MOSFETs on Si substrate", IEEE Transactions on Electron Devices, Vo. 60, No. 9, pp. 2761-2767, Sep. 2013. (Year: 2013).*
(Continued)

*Primary Examiner* — Tong-Ho Kim
(74) *Attorney, Agent, or Firm* — Fujitsu Patent Center

(57) ABSTRACT

A semiconductor device includes: a semiconductor layer of a first conductivity type formed over a substrate; a plurality of semiconductor nanowires formed of a compound semiconductor of the first conductivity type extending above the semiconductor layer; and a gate electrode formed around the semiconductor nanowires in a connection portion between the semiconductor layer and the semiconductor nanowires.

9 Claims, 14 Drawing Sheets

(51) Int. Cl.
*H01L 29/417* (2006.01)
*H01L 29/423* (2006.01)
*H01L 21/02* (2006.01)
*H01L 21/28* (2006.01)
*H01L 21/285* (2006.01)
*H01L 29/66* (2006.01)

(52) U.S. Cl.
CPC .. *H01L 29/42392* (2013.01); *H01L 29/66522* (2013.01); *H01L 29/66742* (2013.01); *H01L 29/78681* (2013.01); *H01L 29/78696* (2013.01)

(58) Field of Classification Search
CPC ........... H01L 29/02603; H01L 29/0262; H01L 29/28264; H01L 29/28575
USPC .......................................................... 257/329
See application file for complete search history.

(56) References Cited

U.S. PATENT DOCUMENTS

| | | | |
|---|---|---|---|
| 2010/0327258 A1* | 12/2010 | Lee | H01L 33/08 257/14 |
| 2011/0050332 A1 | 3/2011 | Kasai | |
| 2012/0061641 A1* | 3/2012 | Seong | H01L 33/04 257/13 |
| 2012/0313078 A1 | 12/2012 | Fukui et al. | |
| 2013/0240983 A1 | 9/2013 | Larrieu | |
| 2016/0204224 A1* | 7/2016 | Fukui | H01L 29/66356 438/198 |
| 2016/0284536 A1 | 9/2016 | Fukui et al. | |
| 2018/0219084 A1 | 8/2018 | Wernersson et al. | |

FOREIGN PATENT DOCUMENTS

| | | |
|---|---|---|
| JP | 2009-288214 A | 12/2009 |
| JP | 2010-503981 A | 2/2010 |
| JP | 2014-503998 A | 2/2014 |
| JP | 2014-49628 A | 3/2014 |
| JP | 2015-34115 A | 2/2015 |
| WO | 2011/105397 A1 | 9/2011 |
| WO | 2015/064094 A1 | 5/2015 |
| WO | 2016/207127 A1 | 12/2016 |

OTHER PUBLICATIONS

Katsuhiko Nishiguchi et al., "Detecting Signals Buried in Noise via Nanowire Transistors Using Stochastic Resonance", Applied Physics Letters 101, 193108 (2012); doi: 10.1063/1.4766946, NTT Basic Research Laboratories, Nippon Telegraph and Telephone Corporation; http://dx.doi.org/10.1063/1.4766946, Published online Nov. 9, 2012) (Total 5 pages).

Seiya Kasai et al., "Stochastic Resonance in Schottky Wrap Gate-controlled GaAs Nanowire Field-Effect Transistors and Their Networks", Applied Physics Express 1 083001 (2008), The Japan Society of Applied Physics, published online Jul. 25, 2008 (Total 4 pages).

Bitan Bhar et al., "Stochastic Resonance in Insulator-Metal-Transition Systems", Scientific Reports, 10:5549, pp. 1-11, (2020); https://doi.org/10.1038/s41598-020-62537-3 (Total 11 pages).

International Search Report and Written Opinion of the International Searching Authority (Form PCT/ISA/210, 220, and 237), mailed in connection with PCT/JP2018/009402 and dated Jun. 5, 2018 (14 pages).

* cited by examiner

SEMICONDUCTOR DEVICE AND METHOD FOR MANUFACTURING SEMICONDUCTOR DEVICE

CROSS-REFERENCE TO RELATED APPLICATION

This application is a continuation application of International Application PCT/JP2018/009402 filed on Mar. 12, 2018 and designated the U.S., the entire contents of which are incorporated herein by reference.

FIELD

The embodiments discussed herein are related to a semiconductor device and a method for manufacturing a semiconductor device.

BACKGROUND

Transistors made of semiconductor materials have been used in various electronic devices including computers and the like. Examples of such transistors include a complementary metal-oxide-semiconductor (CMOS) transistor, which has been downsized for miniaturization and enhanced performance.

Japanese Laid-open Patent Publication No. 2009-212551, Katsuhiko Nishiguchi and Akira Fujiwara, "Detecting signals buried in noise via nanowire transistors using stochastic resonance" Appl. Phys. Lett. 101, 193108 (2012); doi: 10.1063/1.4765946, and Seiya Kasai and Tetsuya Asai, "Stochastic Resonance in Schottky Wrap Gate-controlled GaAs Nanowire Field-Effect Transistors and Their Networks" Applied Physics Express 1 (2008) 083001 are disclosed as related art.

SUMMARY

According to an aspect of the embodiments, A semiconductor device includes: a semiconductor layer of a first conductivity type formed over a substrate; a plurality of semiconductor nanowires formed of a compound semiconductor of the first conductivity type extending above the semiconductor layer; and a gate electrode formed around the semiconductor nanowires in a connection portion between the semiconductor layer and the semiconductor nanowires.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
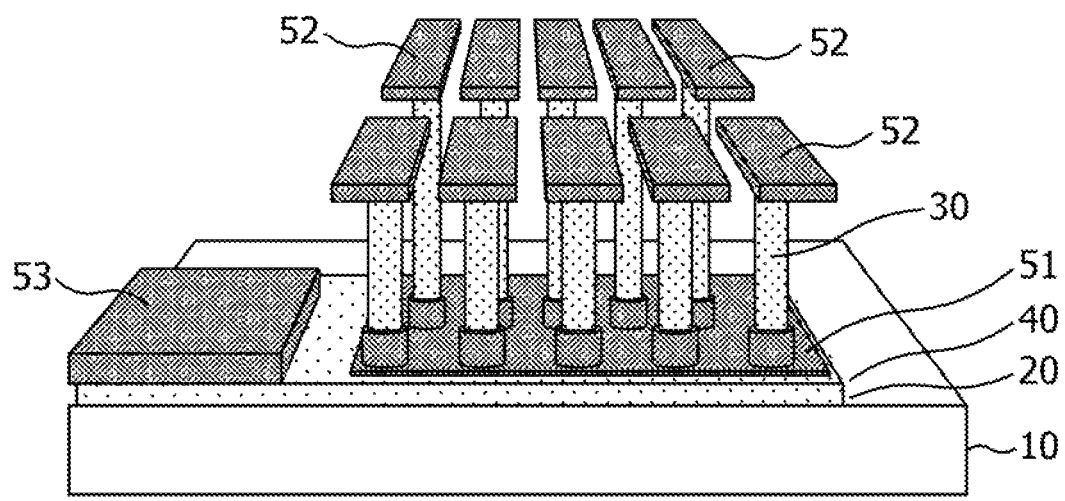
FIG. 1 is structural diagram of a semiconductor device according to a first embodiment.

For example, there has been a transistor whose operating principle is a stochastic resonance phenomenon as a transistor that operates under a new concept. This transistor has potential to achieve unprecedented power-saving computers and sensing with high sensitivity.

Meanwhile, in a transistor whose operating principle is a stochastic resonance phenomenon, a source and the like are branched into multiple branches and the number of branches is increased to improve the performance; however, the increased number of branches needs a larger area, which leads to an increase in size.

In view of the above, a transistor whose operating principle is a stochastic resonance phenomenon, which is a semiconductor device, has been in need of higher performance and being downsized.

Hereinafter, embodiments will be described. Note that the same members and the like are denoted by the same reference numerals and repeated description will be omitted.

First Embodiment (Semiconductor Device)

A semiconductor device according to a first embodiment will be described. The semiconductor device according to the present embodiment serves as a transistor whose operating principle is a stochastic resonance phenomenon, and may be called a stochastic resonance transistor.

As illustrated in FIG. 1, in the semiconductor device according to the present embodiment, a semiconductor layer 20 is formed on a semi-insulating substrate 10, and a plurality of semiconductor nanowires 30 is formed above the semiconductor layer 20. The semiconductor nanowires 30 extend substantially vertically with respect to the substrate surface of the semi-insulating substrate 10, in other words, upward. An insulating film 40 is formed around the region where the semiconductor nanowires 30 are formed above the semiconductor layer 20, and a gate electrode 51 is formed on the insulating film 40 and around the semiconductor nanowires 30 in the vicinity of the connection portion between the semiconductor layer 20 and the semiconductor nanowires 30. Note that an insulating film is formed on the side surfaces of the semiconductor nanowires 30 in the present embodiment, and the gate electrode 51 may be formed around the semiconductor nanowires 30 in the vicinity of the connection portion between the semiconductor layer 20 and the semiconductor nanowires 30 through the insulating film. Furthermore, a drain electrode 53 is formed in a region different from the region where the insulating film 40 is formed on the semiconductor layer 20, and a source electrode 52 is formed on the upper end of each semiconductor nanowire 30.

The semi-insulating substrate 10 is made of a gallium arsenide (GaAs) crystal substrate that is a semiconductor substrate not doped with an impurity element. The semiconductor layer 20 is made of an n-GaAs film having a thickness of 200 nm, and the semiconductor nanowire 30 is made of an n-indium arsenide (InAs) nanowire that is a compound semiconductor. The semiconductor nanowire 30 has a diameter of about 50 nm, and a length of 0.5 μm to 0.7 μm. In the semiconductor device having the structure illustrated in FIG. 1, ten semiconductor nanowires 30 are formed above the semiconductor layer 20. Note that the semiconductor layer 20 and the semiconductor nanowire 30 are doped with sulfur (S) as an n-type impurity element.

The insulating film 40 is made of a silicon nitride (SiN) film having a thickness of 50 nm, and the gate electrode 51, the source electrode 52, and the drain electrode 53 are made of a metal laminated film obtained by sequentially laminating gold (Au), inorganic phosphate (Pi), and titanium (Ti).

In the semiconductor device according to the present embodiment, one semiconductor layer 20 forms a semiconductor region from the drain electrode 53 to each gate electrode 51, and the semiconductor nanowire 30 forms a semiconductor region from each gate electrode 51 to each source electrode 52. Therefore, each semiconductor nanowire 30 extending substantially perpendicularly from the surface of the semiconductor layer 20 is formed in the region where each gate electrode 51 is formed, and the semiconductor region is branched and formed. In the semiconductor device having the structure illustrated in FIG. 1, ten semiconductor nanowires 30 are formed, the semiconductor region is branched into ten, and each source electrode 52 is formed at the upper end of each semiconductor nanowire 30. Note that the gate electrode 51 is integrally formed in the semiconductor device according to the present embodiment.

The semiconductor device according to the present embodiment receives, at the gate electrode 51, a pulse having a voltage lower than a gate threshold voltage and a noise component, and a current flows between the gate electrode 51 and the source electrode 52 when the sum of the pulse and the noise component exceeds the gate threshold voltage.

Therefore, as a plurality of semiconductor nanowires 30 branched from the semiconductor layer 20 is formed, the semiconductor device according to the present embodiment serves as a high-performance transistor whose operating principle is a stochastic resonance phenomenon. Furthermore, in the semiconductor device according to the present embodiment, the semiconductor nanowires 30 extend in a direction substantially perpendicular to the substrate surface of the semi-insulating substrate 10 and may be formed in a narrow region, whereby the semiconductor device may be made smaller than a planar semiconductor device.

Therefore, a high-performance transistor whose operating principle is a stochastic resonance phenomenon may be downsized.

Figure 2:
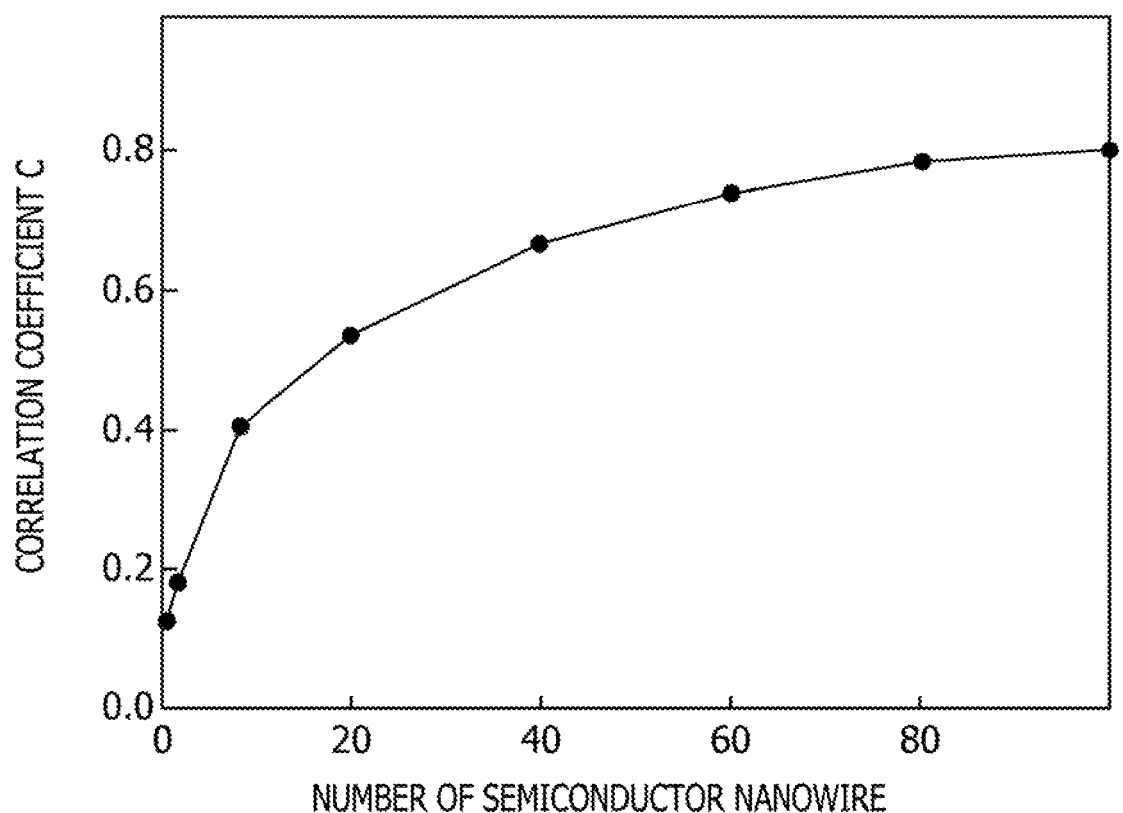
FIG. 2 is a correlation chart between a correlation coefficient and the number of semiconductor nanowires of the semiconductor device according to the first embodiment.

FIG. 2 illustrates a relationship between a correlation coefficient C and the number of semiconductor nanowires 30 in the semiconductor device according to the present embodiment. The correlation coefficient C serves as an index indicating a degree of restorability of the original information, and the restoration rate of the original signal becomes higher as the correlation coefficient becomes higher.

Specifically, for example, the correlation coefficient C is 0.124 when the number of the semiconductor nanowires 30 is 1, the correlation coefficient C is 0.181 when the number of the semiconductor nanowires 30 is 2, and the correlation coefficient C is 0.406 when the number of the semiconductor nanowires 30 is 8. Furthermore, the correlation coefficient C is 0.537 when the number of the semiconductor nanowires 30 is 20, the correlation coefficient C is 0.667 when the number of the semiconductor nanowires 30 is 40, and the correlation coefficient C is 0.739 when the number of the semiconductor nanowires 30 is 60. The correlation coefficient C is 0.784 when the number of the semiconductor nanowires 30 is 80, and the correlation coefficient C is 0.817 when the number of the semiconductor nanowires 30 is 100.

It is generally said that the correlation coefficient C is preferably 0.6 or more, and more preferably 0.7 or more. According to FIG. 2, the average correlation coefficient C of the cases where the number of the semiconductor nanowires 30 is 20 and 40 is 0.602, and the average correlation coefficient C of the cases where the number of the semiconductor nanowires 30 is 40 and 60 is 0.703. In view of the above, the number of the semiconductor nanowires 30 is preferably 30 or more, and more preferably 50 or more.

(Operation of Semiconductor Device)

The semiconductor device according to the present embodiment may be operated as a transistor whose operating principle is a stochastic resonance phenomenon using the following driving method. First, a drain voltage $V_d$ to be applied to the drain electrode 53 is adjusted so that the dependency of a current $I_s$ on a gate voltage $V_g$ becomes steep. Under this condition, a high frequency is input as a noise source and a swing is applied. As a result, the characteristic of $I_s$ with respect to $V_g$ has hysteresis. Since the hysteresis characteristic has a function same as that of the bistable potential, when signals of equal to or lower than a threshold level are supplied with the gate electrode 51 serving as an input terminal in this state, the semiconductor device according to the present embodiment is allowed to operate as a stochastic resonance element.

(Method for Manufacturing Semiconductor Device)

Next, a method for manufacturing the semiconductor device according to the present embodiment will be described with reference to FIGS. 3A to 7B.

Figure 3A:
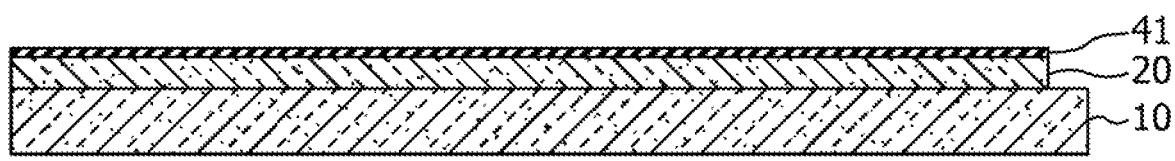
FIGS. 3A and 3B are process drawings (1) of a method for manufacturing a semiconductor device according to the first embodiment.

First, as illustrated in FIG. 3A, the semiconductor layer 20 is formed on the semi-insulating substrate 10, and an insulating film 41 is formed on the semiconductor layer 20. A semi-insulating (SI)-GaAs(111)B substrate not doped with an impurity element is used as the semi-insulating substrate 10. The semiconductor layer 20 forms an $n^+$-GaAs film having a thickness of 200 nm by metal organic chemical vapor deposition (MOCVD). The semiconductor layer 20 is doped with Si as an impurity element at a concentration of $5\times10^{18}$ cm$^{-3}$. When the n-GaAs film serving as the semiconductor layer 20 is formed, trimethylgallium (TMGa) is supplied as a raw material gas of Ga, arsine ($AsH_3$) is supplied as a raw material gas of As, and hydrogen sulfide ($H_2S$) is supplied as a raw material gas of S to be an impurity element. The insulating film 41 is formed by forming a SiN film having a thickness of about 50 nm by plasma chemical vapor deposition (CVD).

Figure 3B:
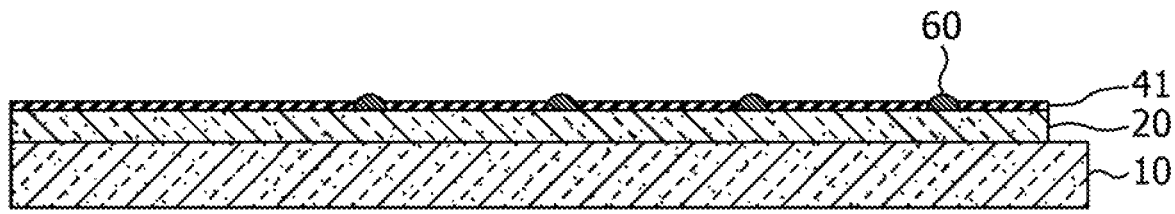

Next, as illustrated in FIG. 3B, an opening is formed in the insulating film 41 in the region where the semiconductor nanowire 30 is formed, and a catalyst layer 60 is formed on the semiconductor layer 20 exposed in the opening. Specifically, for example, a photoresist is applied on the insulating film 41, and an exposure device performs exposure and development to form a resist pattern (not illustrated) having the opening in the region where the semiconductor nanowire 30 is formed. Subsequently, the insulating film 41 in the region where no resist pattern is formed is removed by reactive ion etching (RIE) or the like, and an opening is formed in the insulating film 41 to expose the surface of the semiconductor layer 20. Subsequently, An Au film is formed by electron beam (EB) vapor deposition or the like, and is then immersed in an organic solvent to remove, by lift-off, the Au film formed on the resist pattern together with the resist pattern. As a result, the Au remaining on the surface of the semiconductor layer 20, which is to be the region where the semiconductor nanowire 30 is formed, forms the catalyst layer 60. The catalyst layer 60 formed in such a manner serves as a growth catalyst for the semiconductor nanowire, and has a diameter of 20 nm to 100 nm, which is, for example, 50 nm.

Figure 4A:
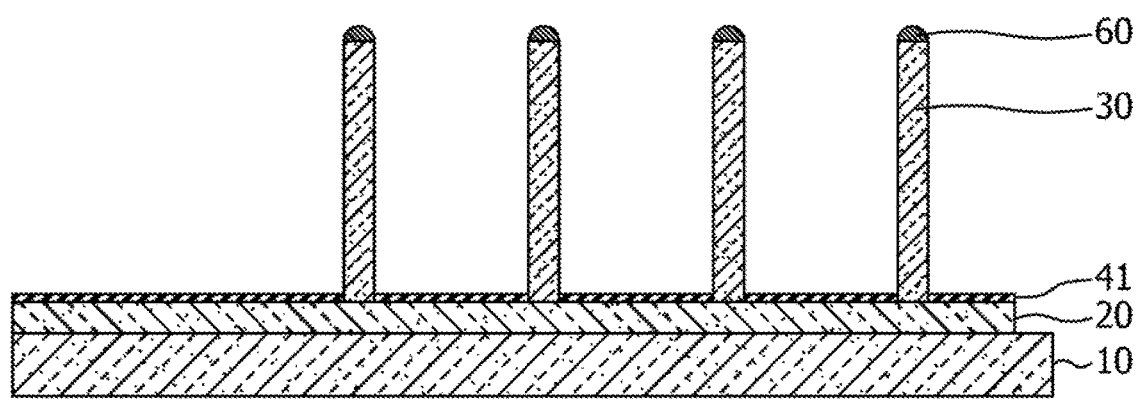
FIGS. 4A and 4B are process drawings (2) of the method for manufacturing a semiconductor device according to the first embodiment.

Next, as illustrated in FIG. 4A, the semiconductor nanowire 30 is formed by MOCVD. Specifically, for example, trimethylindium (TMIn), $AsH_3$, and the like are supplied at a growth temperature of 400° C. to 500° C. so that n-InAs is subject to crystal growth in the region where the catalyst layer 60 is formed, thereby forming an n-InAs nanowire to be the semiconductor nanowire 30. The semiconductor nanowire 30 is formed by growing the nanowire on the semiconductor layer 20 until the nanowire length becomes 0.5 μm to 0.7 μm. When the n-InAs nanowire to be the semiconductor nanowire 30 is formed, $H_2S$ is also supplied to be doped with S as an impurity element.

Figure 4B:
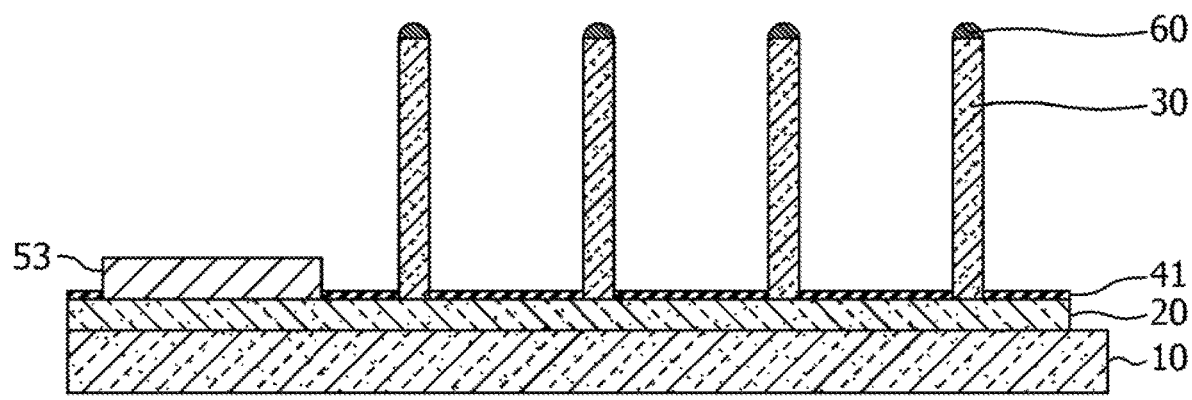

Next, as illustrated in FIG. 4B, the drain electrode 53 is formed on the semiconductor layer 20 in a region different from the region where the semiconductor nanowire 30 is formed. Specifically, for example, a photoresist applied on the catalyst layer 60, the semiconductor nanowire 30, and the insulating film 41, and an exposure device performs exposure and development to form a resist pattern (not illustrated) having an opening in the region where the drain electrode 53 is formed. Subsequently, the insulating film 41 in the region where no resist pattern is formed is removed by RIE or the like to form an opening on the insulating film 41, whereby the surface of the semiconductor layer 20 is exposed. Subsequently, a metal laminated film is formed by sequentially laminating Au, platinum (Pt), and Ti by vacuum deposition, and is then immersed in an organic solvent to remove, by lift-off, the metal laminated film on the resist pattern together with the resist pattern. As a result, the remaining metal laminated film forms the drain electrode 53. Note that the metal laminated film in which Au, Pt, and 11 are sequentially laminated is a film having both favorable adhesion and ohmic characteristic.

Figure 5A:
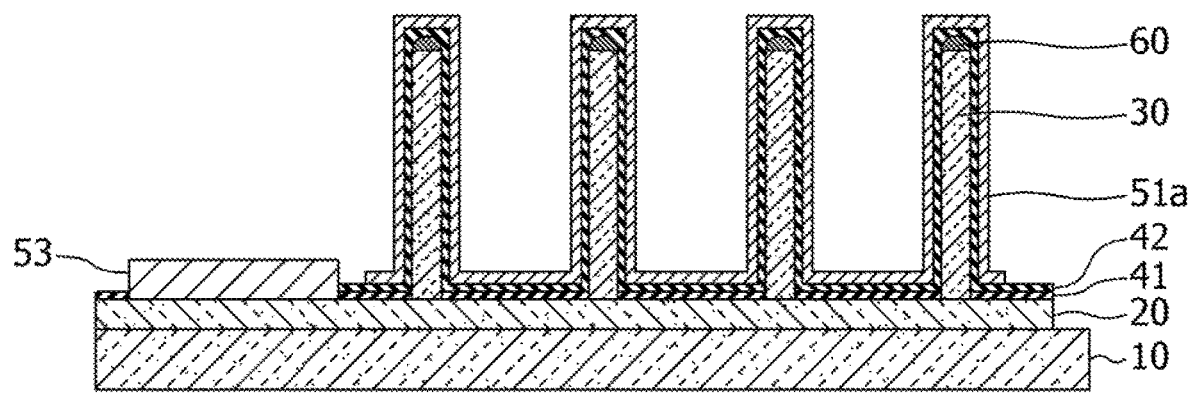
FIGS. 5A and 5B are process drawings (3) of the method for manufacturing a semiconductor device according to the first embodiment.

Next, as illustrated in FIG. 5A, an insulating film 42 is formed on the side surface of the semiconductor nanowire 30, the surface of the catalyst layer 60, and the surface of the insulating film 41, and a metal film 51a is further formed on the insulating film 42. Specifically, for example, the insulating film 42 is formed by forming an aluminum oxide (AlO) film using an atomic layer deposition (ALD) method. Furthermore, the metal film 51a is a metal laminated film, which is formed by sequentially laminating Au, Pt, and Ti by vacuum deposition. As a result, the insulating film 42 and the metal film 51a are laminated and formed around the side surface of the semiconductor nanowire 30 and the like. Note that, at the time of forming the insulating film 42 and the metal film 51a, the region where the drain electrode 53 is formed may be covered with a metal mask or the like so as not to form the insulating film 42 and the metal film 51a in the region.

Figure 5B:
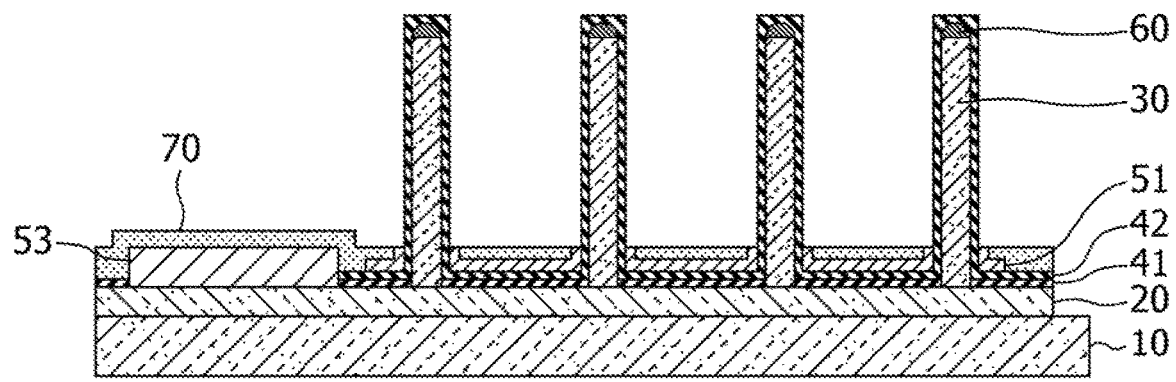

Next, as illustrated in FIG. 5B, a resist pattern 70 is formed on the region where the gate electrode 51 is formed and on the drain electrode 53, and the metal film 51a in the region where no resist pattern 70 is formed is removed to form the gate electrode 51. Specifically, for example, a photoresist is applied on the metal film 51a and the drain electrode 53, and an exposure device performs exposure and development to form the resist pattern 70. The resist pattern 70 covers the region where the gate electrode 51 is formed and the drain electrode 53, and is not formed around the side surface of the semiconductor nanowire 30 except the region in the vicinity of the semiconductor layer 20. Subsequently, the metal film 51a around the side surface of the semiconductor nanowire 30 where no resist pattern 70 is formed is removed by ion etching with argon (Ar) and the like. As a result, the remaining metal film 51a forms the gate electrode 51 on the insulating film 41 via the insulating film 42 and in the vicinity of the connection portion between the semiconductor layer 20 and the semiconductor nanowire 30.

Figure 6A:
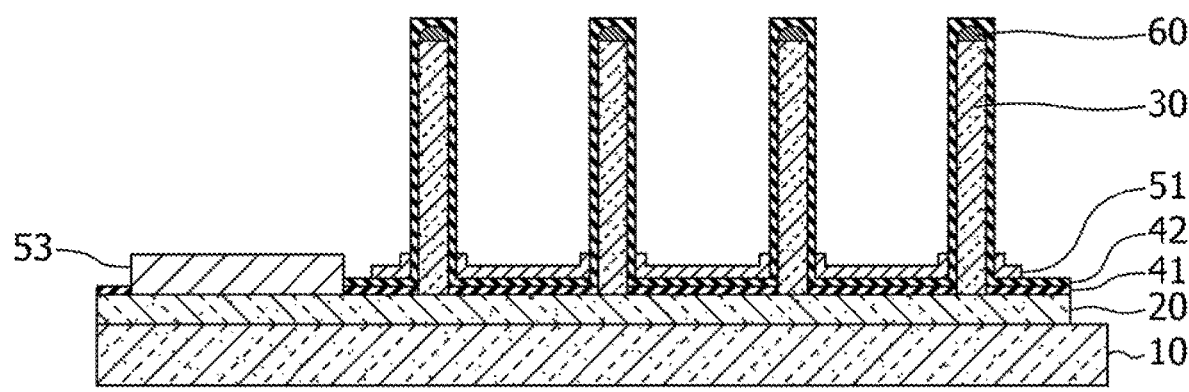
FIGS. 6A and 6B are process drawings (4) of the method for manufacturing a semiconductor device according to the first embodiment.

Next, as illustrated in FIG. 6A, the resist pattern 70 is removed using an organic solvent or the like.

Figure 6B:
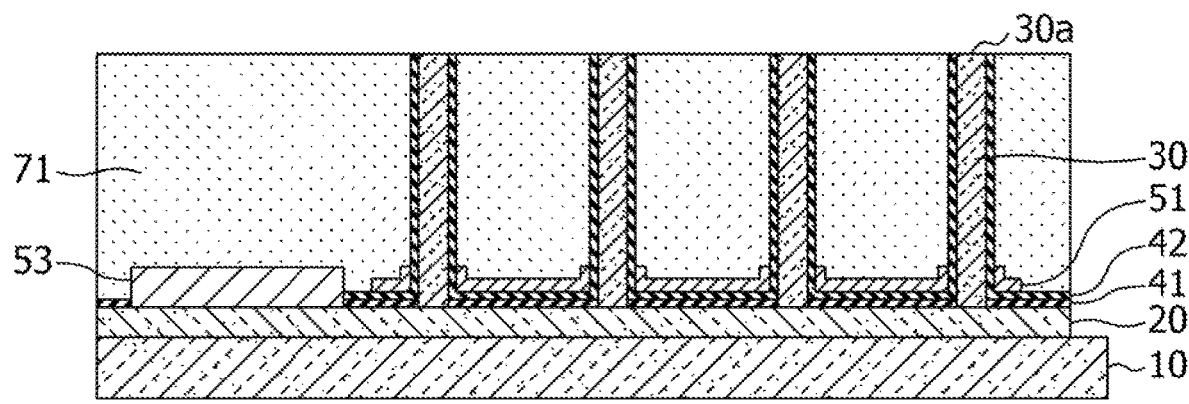

Next, as illustrated in FIG. 6B, a resin layer 71 made of an insulator covers the entire area, and then the resin layer 71 is etched back to expose the upper end of the semiconductor nanowire 30. Specifically, for example, the resin layer 71 is formed in such a manner that benzocyclobutene (BCB) or the like is applied with a spin coater and then heating and thermal curing are performed. As a result, the semiconductor nanowire 30, the gate electrode 51, and the insulating film 42 are entirely covered with the resin layer 71. Subsequently, the resin layer 71, a part of the insulating film 42, and the catalyst layer 60 are etched back and removed so that an upper end 30a of the semiconductor nanowire 30 is exposed. This etching back is performed by dry etching.

Figure 7A:
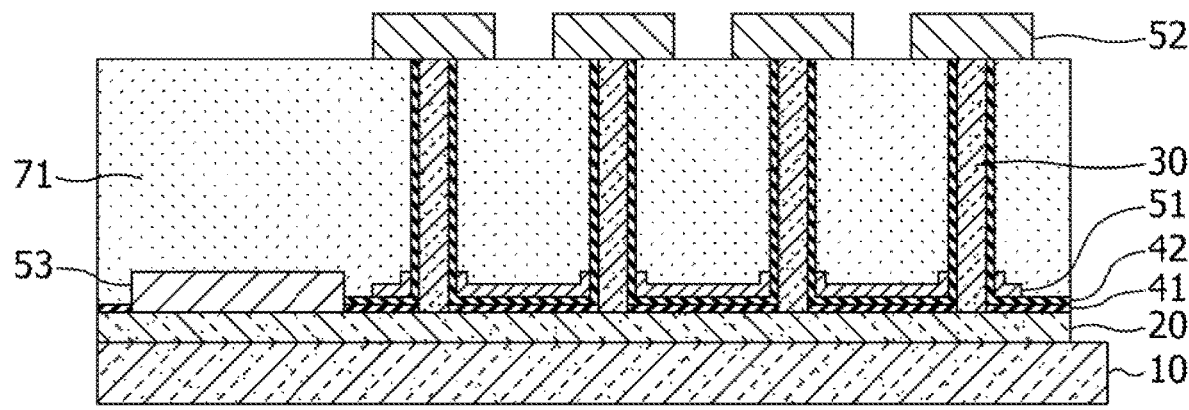
FIGS. 7A and 7B are process drawings (5) of the method for manufacturing a semiconductor device according to the first embodiment.

Next, as illustrated in FIG. 7A, the source electrode 52 is formed on the exposed upper end 30a of the semiconductor nanowire 30. Specifically, for example, a photoresist is applied on the resin layer 71 and the upper end 30a of the semiconductor nanowire 30, and an exposure device performs exposure and development to form a resist pattern (not illustrated) having an opening in the region where a p-side electrode 32 is formed. Subsequently, a metal laminated film is formed by sequentially laminating Au, platinum (Pt), and Ti by vacuum deposition, and is then immersed in an organic solvent to remove, by lift-off, the metal laminated film on the resist pattern together with the resist pattern. As a result, the remaining metal laminated film forms the source electrode 52. The source electrode 52 is formed for every semiconductor nanowire 30 in the present embodiment.

Figure 7B:
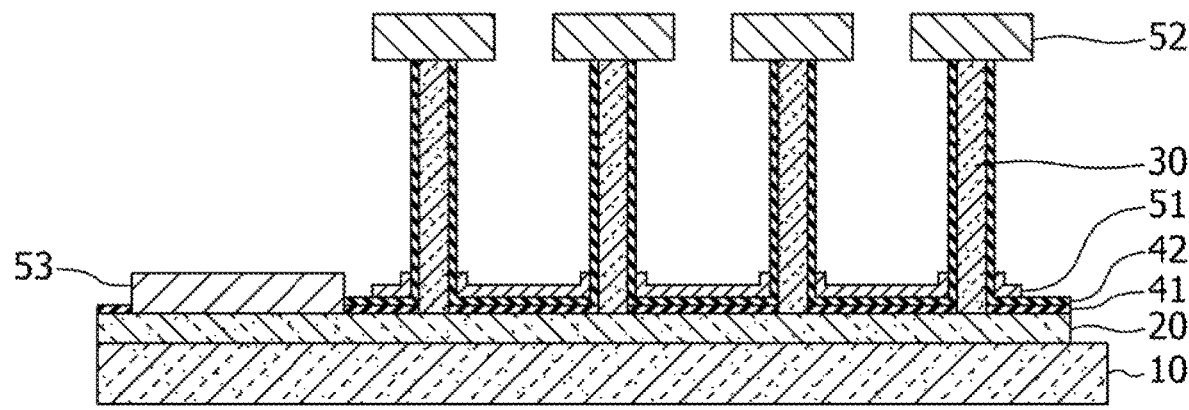

Next, as illustrated in FIG. 7B, the resin layer 71 is removed by wet etching or the like to expose the gate electrode 51 and the drain electrode 53. Since the resin layer 71 does not exist around the semiconductor nanowire 3C, with the resin layer 71 being removed, a parasitic capacitance may be reduced and a frequency characteristic is improved.

Figure 8:
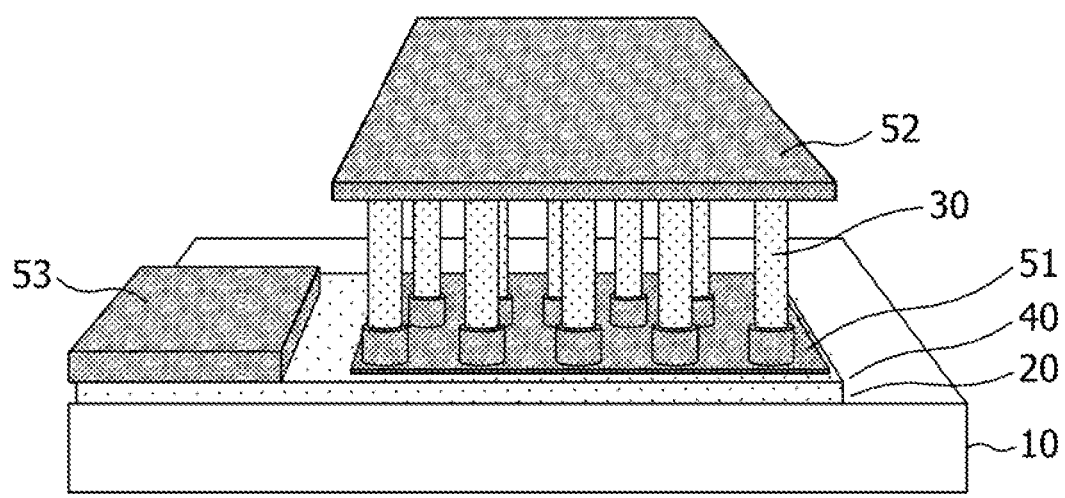
FIG. 8 is structural diagram of a variation of the semiconductor device according to the first embodiment.

Note that, in the present embodiment, the insulating film 40 in the semiconductor device illustrated in FIG. 1 is formed by the insulating film 41 and the insulating film 42 formed on the insulating film 41 described above. Furthermore, as illustrated in FIG. 8, the source electrodes 52 to be formed on the upper ends of the multiple semiconductor nanowires 30 may be integrally formed in the semiconductor device according to the present embodiment.

Second Embodiment

Figure 9:
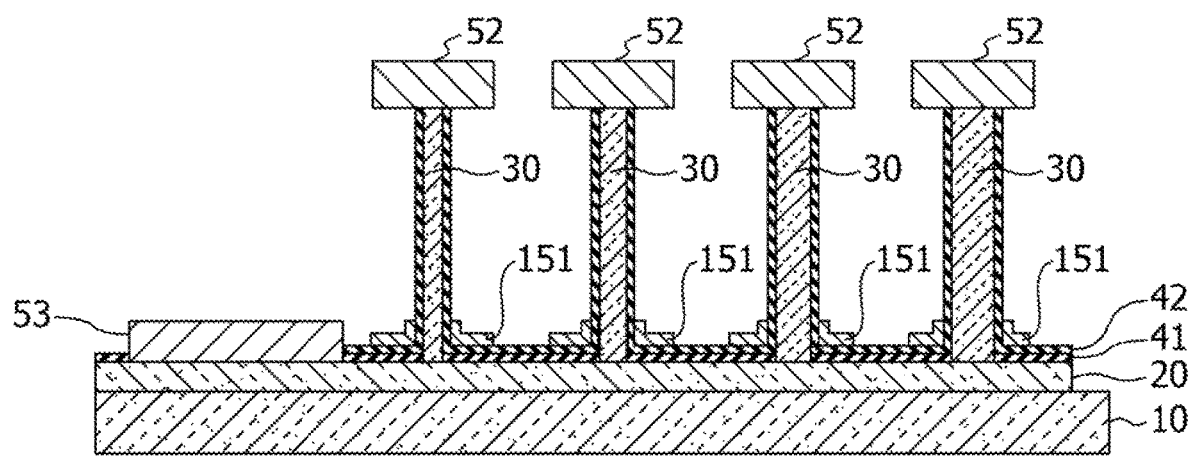
FIG. 9 is structural diagram of a semiconductor device according to a second embodiment.

Next, a semiconductor device according to a second embodiment will be described. As illustrated in FIG. 9, the semiconductor device according to the present embodiment has a structure in which a gate electrode 151 is provided corresponding to each semiconductor nanowire 30, and each gate electrode 151 is formed separately. With the gate electrode 151 being formed separately in this manner, it becomes possible to control each branched semiconductor nanowire 30.

Furthermore, in the present embodiment, a thickness of each semiconductor nanowire 30 may be changed and formed. For example, the semiconductor nanowire 30 may be formed to have a diameter of 20 nm, 30 nm, 50 nm, or 100 nm.

The diameter of the semiconductor nanowire 30 may be adjusted by a size of a catalyst layer 60 and a diameter of an opening of an insulating film 40 at the time of forming the semiconductor nanowire. By changing the diameter of the semiconductor nanowire 30 in this manner, it becomes possible to change a carrier concentration generated at the interface between the insulating film and the semiconductor nanowire, whereby the gate threshold voltage can be shifted. Such shifting of the gate threshold voltage corresponds to making responses of branch channels asynchronous with each other, and allows it to function as a desired stochastic resonance transistor. Furthermore, by separating the gate electrode 151 to correspond to each semiconductor nanowire 30 as in the present embodiment, it becomes possible to change the gate voltage independently, whereby noise input itself can be shifted.

A method of shifting the characteristic of each gate threshold voltage is not limited thereto, and for example, a structure in which the thickness of the insulating film 42 is changed for each semiconductor nanowire 30 may be used.

Note that contents other than the above are similar to those in the first embodiment.

Third Embodiment

Next, a third embodiment will be described. The present embodiment is an imaging device using the semiconductor device according to the first or second embodiment.

Figure 10:
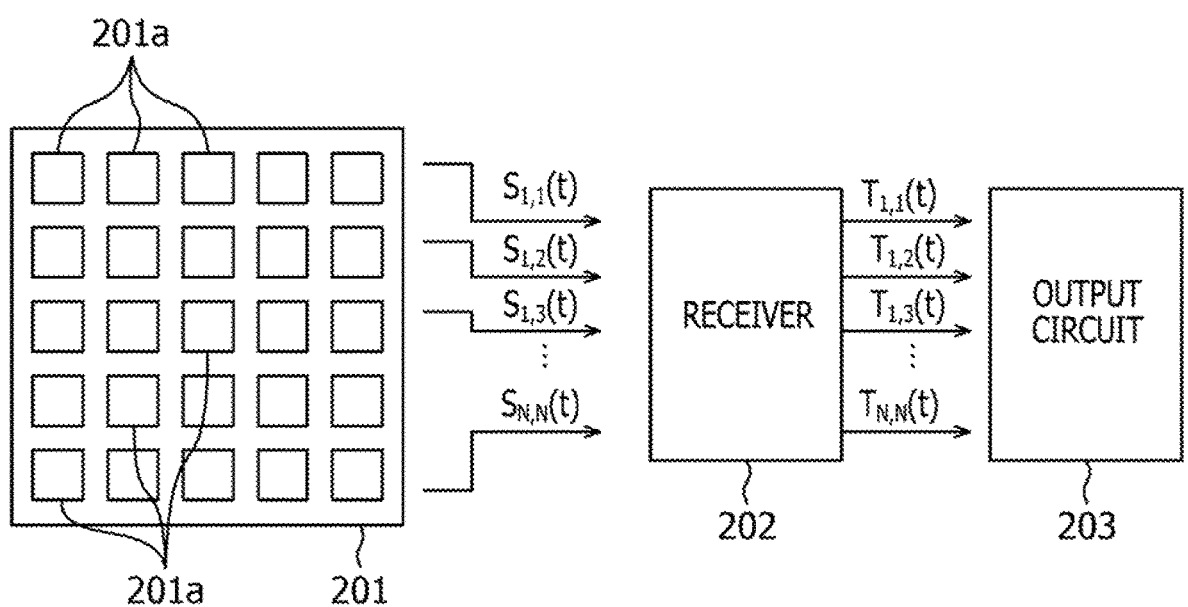
FIG. 10 is a configuration diagram of an imaging device according to a third embodiment.

As illustrated in FIG. 10, an imaging device 200 according to the present embodiment includes an image sensor 201, a receiver 202, and an output circuit 203.

The image sensor 201 is, for example, a CMOS image sensor or a charge coupled device (CCD), and includes N×N (N is a natural number) pixels 201a arranged in a matrix in a plane. Each pixel 201a receives light and outputs a pixel signal $S_{i,j}(t)$ (1≤i, j≤N) according to its intensity.

Furthermore, the receiver 202 receives the pixel signal $S_{i,j}(t)$ from the image sensor 201, and outputs an output signal $T_{i,j}(t)$ (1≤i, j≤N) obtained by amplifying the pixel signal to the output circuit 203 in the subsequent stage. The output circuit 203 converts the output signal $T_{i,j}(t)$ received from the receiver 202 into a predetermined format and outputs it to a display (not illustrated).

Figure 11:
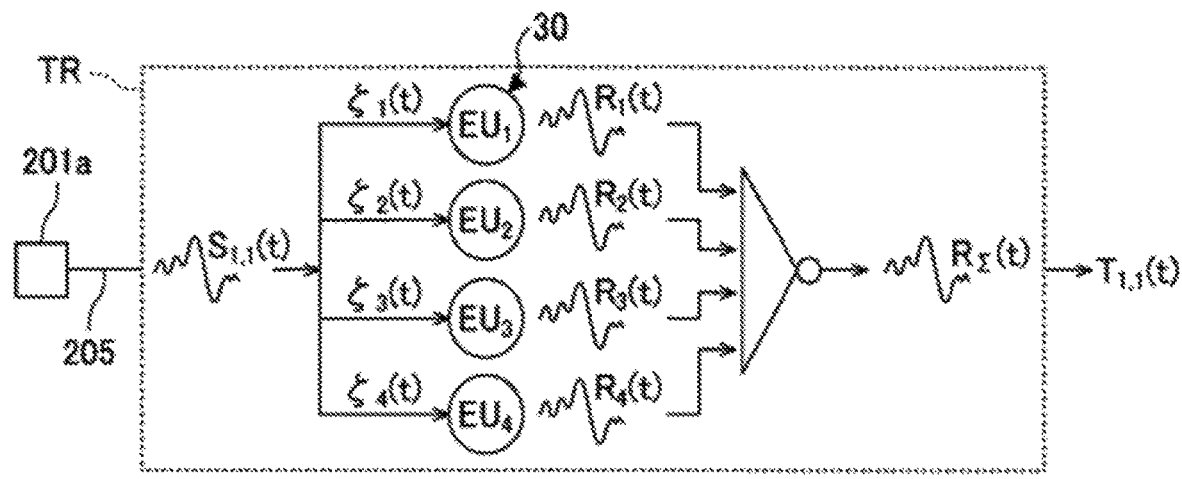
FIG. 11 is a configuration diagram of a receiver of the imaging device according to the third embodiment.
Figure 11:
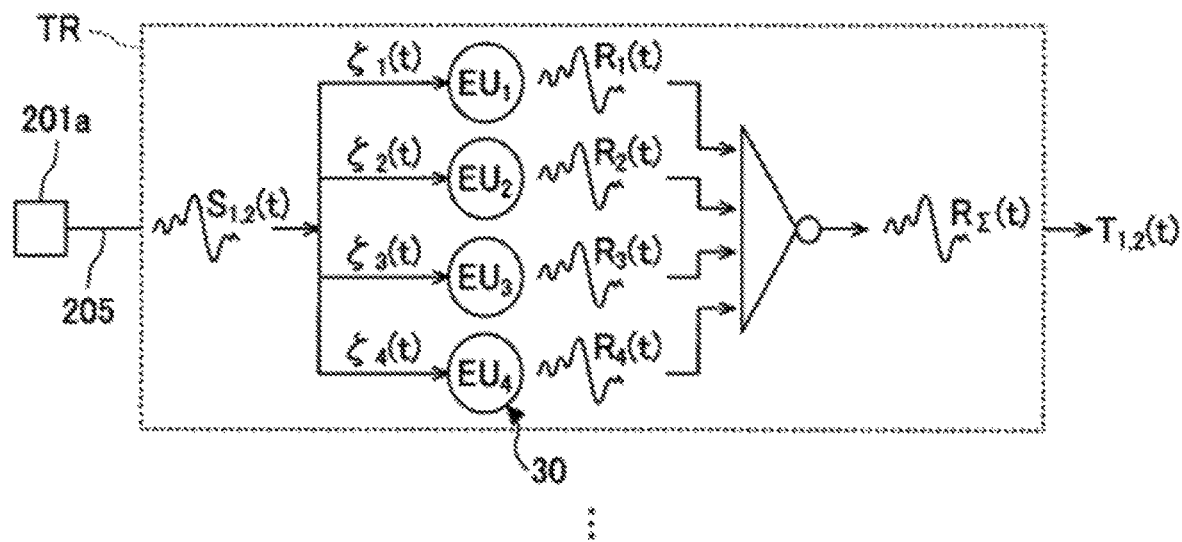
Figure 11:
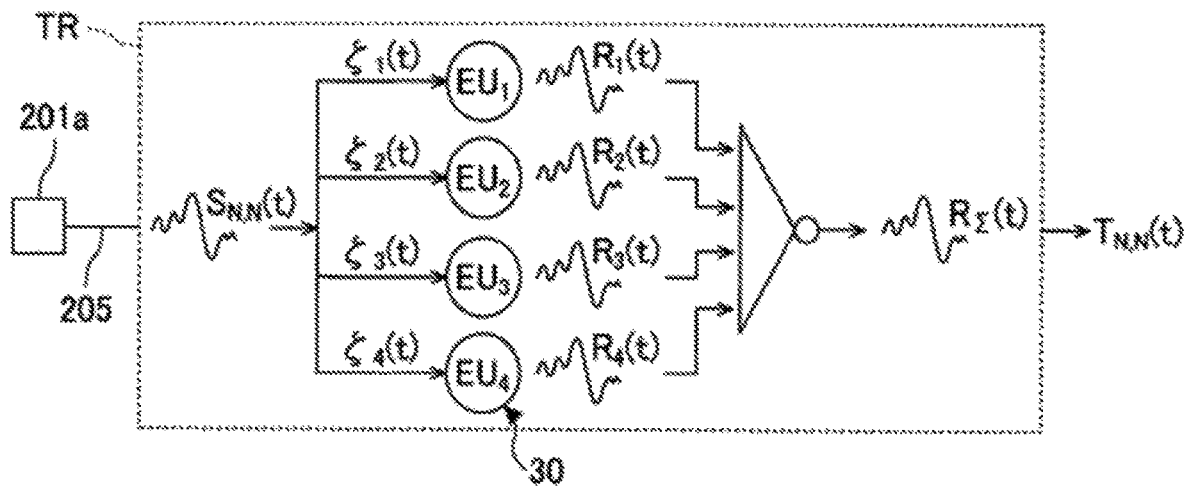

FIG. 11 is a circuit diagram of the receiver 202. As illustrated in FIG. 11, the receiver 202 includes a plurality of transistors TR corresponding to each of the plurality of pixels 201a. The transistor TR is the semiconductor device according to the first or second embodiment.

A gate electrode of each transistor TR is connected to a signal line 205 to be connected to the corresponding pixel 201a, and receives the pixel signal $S_{i,j}(t)$ via the signal line 205. Furthermore, each transistor TR is provided with element parts $EU_1$ to $EU_4$ corresponding to four semiconductor nanowires 30.

Each of the element parts $EU_1$ to $EU_4$ amplifies the pixel signal $S_{i,j}(t)$ and outputs source currents $R_1(t)$ to $R_4(t)$. Those source currents $R_1(t)$ to $R_4(t)$ are added together to form a source current $R_\Sigma$, and the source current $R_\Sigma(t)$ is output as an output signal $T_{i,j}(t)$.

Since each transistor TR is a transistor whose operating principle is a stochastic resonance phenomenon, even when the pixel signal $S_{i,j}(t)$ is weak, the output signal $T_{i,j}(t)$ with a high S/N ratio may be output and a clear image may be displayed on a display. In other words, even in a case where a signal for forming a pixel in the pixel signal $S_{i,j}(t)$ is buried in noise, a clear image may be displayed on the display.

Note that, although the case where the transistor TR having four semiconductor nanowires 30 is assigned to one pixel 201a has been described above, the present embodiment is not limited thereto. For example, the number of semiconductor nanowires 30 in each transistor TR may be two, and two transistors TR may be assigned to one pixel 201a.

Fourth Embodiment

Next, a fourth embodiment will be described. The present embodiment is an arithmetic unit using the semiconductor device according to the first or second embodiment. The arithmetic unit according to the present embodiment will be described with reference to FIG. 12.

An arithmetic unit 300 is a neural network, and includes each of a plurality of input terminals IN1 to IN4, a plurality of transistors TR, and a plurality of synapse devices 301.

The transistor TR is the semiconductor device according to the first or second embodiment, which is provided corresponding to each of the input terminals IN1 to IN4 and functions as a neuron circuit that amplifies the input voltage input from those input terminals IN1 to IN4 and outputs a spike voltage.

The synapse device 301 outputs a postsynaptic current $I_{PSC}$ on the basis of a spike voltage $V_{pre}$ output from the transistor TR corresponding to the presynaptic neuron and a spike voltage $V_{post}$ output from the transistor TR corresponding to the postsynaptic neuron.

Figure 13:
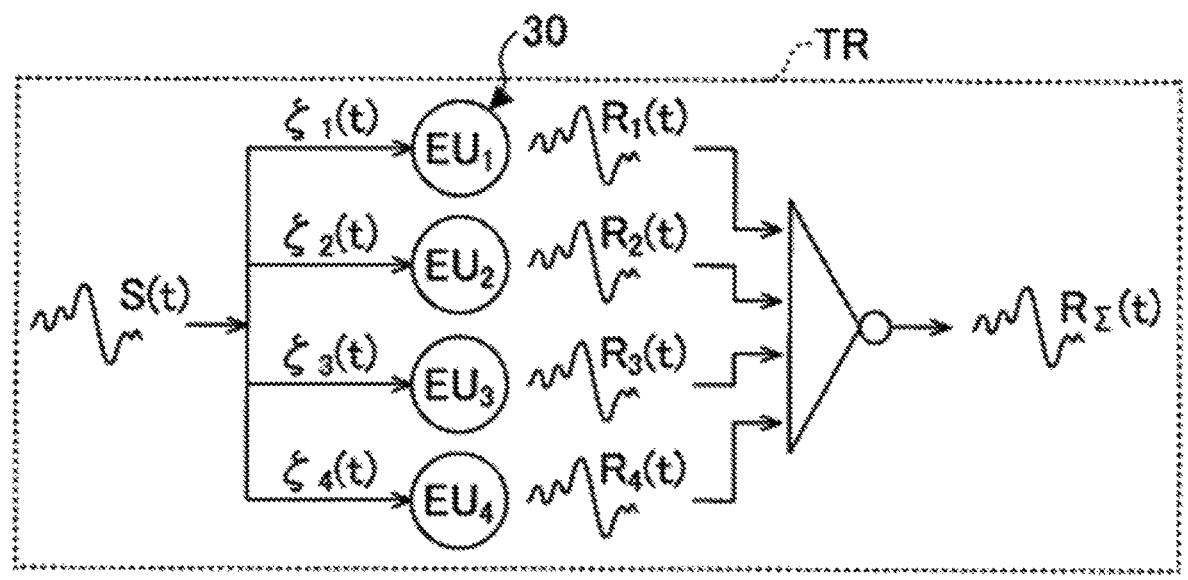
FIG. 13 is an equivalent circuit diagram of a transistor of the arithmetic unit according to the fourth embodiment.

FIG. 13 is an equivalent circuit diagram of the transistor TR. The transistor TR is a transistor whose operating principle is a stochastic resonance phenomenon, and is provided with element parts $EU_1$ to $EU_4$ corresponding to four semiconductor nanowires 30.

The input voltage input from each of the input terminals IN1 to IN4 is applied to, as a signal voltage $5(t)$, each gate electrode of the element parts $EU_1$ to $EU_4$. Source currents $R_1(t)$ to $R_4(t)$ obtained by amplifying the signal voltage S(t) are output from the respective element parts $EU_1$ to $EU_4$, and a source current $R_\Sigma(t)$ obtained by adding those source currents $R_1(t)$ to $R_4(t)$ is output from the transistor TR.

Figure 14:
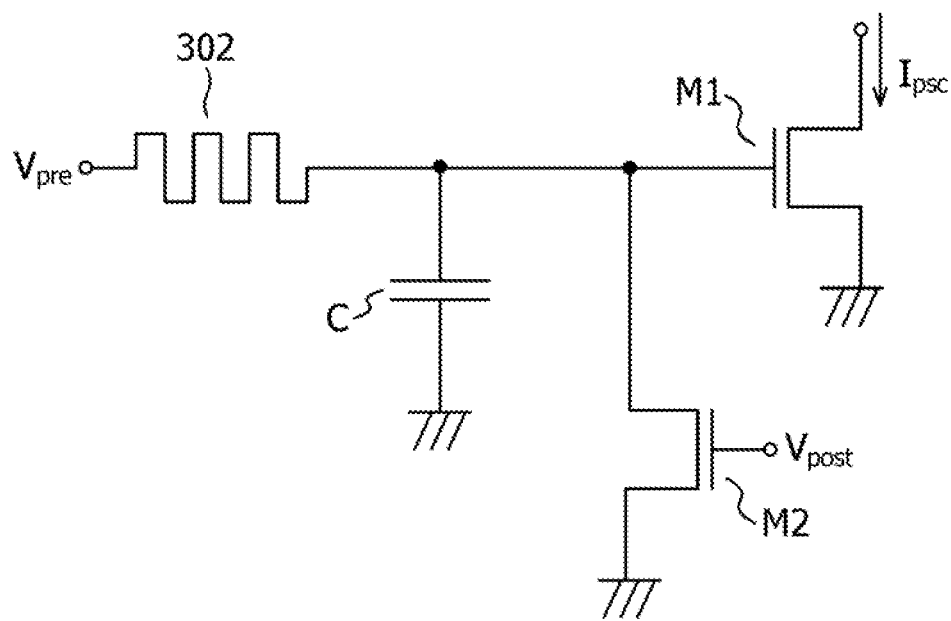
FIG. 14 is a circuit diagram of a synapse device of the arithmetic unit according to the fourth embodiment.

FIG. 14 is a circuit diagram of the synapse device 301. As illustrated in FIG. 14, the synapse device 301 includes a memristor 302, a capacitor C, and transistors M1 and M2.

In such a circuit configuration, in a case where the transistor TR corresponding to the postsynaptic neuron is not fired and the spike voltage $V_{post}$ is at the low level, the transistor M2 is turned off and the capacitor C is subject to charge/discharge via the memristor 302.

Therefore, even in a case where the spike voltage $V_{pre}$ goes to a high level in that state, the spike voltage $V_{pre}$ then goes to a low level to cancel the total amount of charges flowing through the memristor 302, and the conductance of the memristor 302 does not change before and after the spike.

On the other hand, in a case where the spike voltage $V_{post}$ goes to a high level while the capacitor C is charged, the capacitor C is discharged via the transistor M2. Therefore, charges are rarely discharged via the memristor 302 even in a case where the spike voltage $V_{pre}$ goes to a low level in that state, and the conductance of the memristor 302 changes before and after the spike.

As a result, the conductance of the memristor 302 changes depending on the timing of the spike, and the conductance may change the postsynaptic current $I_{PSC}$.

Figure 12:
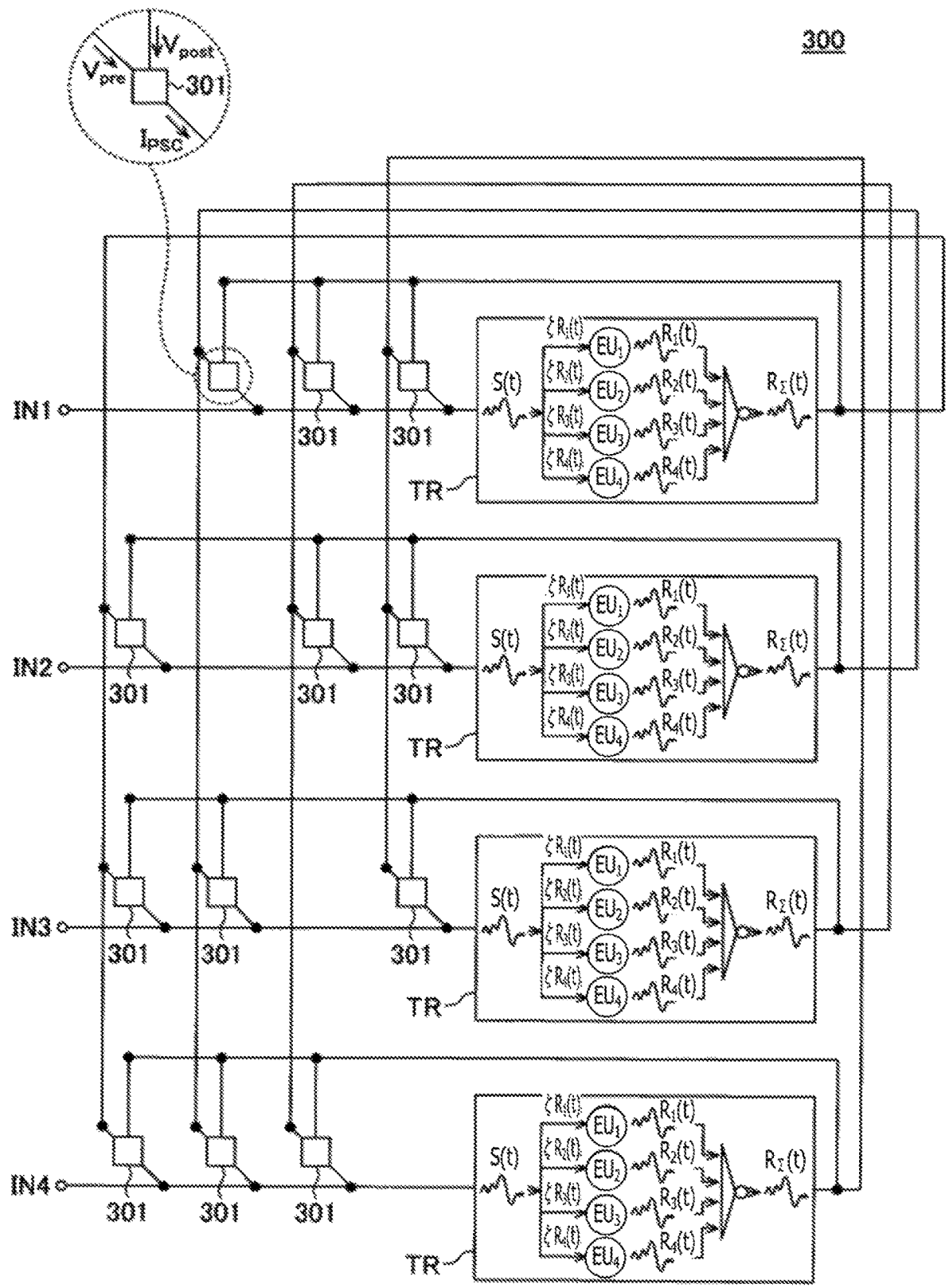
FIG. 12 is a circuit diagram of an arithmetic unit according to a fourth embodiment.

Therefore, in the present embodiment, the transistor TR provided in the neural network illustrated in FIG. 12 functions as a transistor whose operating principle is a stochastic resonance phenomenon. Accordingly, even when the input voltage input from the input terminals IN1 to IN4 is weak, it becomes possible to generate sufficiently large spike voltages $V_{pre}$ and $V_{post}$ with an improved S/N ratio.

Note that, although the neural network using four transistors TR having four semiconductor nanowires 30 has been exemplified above, it is not limited thereto, and the number of synapse devices 301 and the transistors TR may be further increased to increase the scale.

In the above, the embodiments have been described in detail; however, it is not limited to a specific embodiment, and various modifications and changes are possible within the scope described in claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a semiconductor layer of a first conductivity type formed over a substrate;
   a plurality of semiconductor nanowires formed of a compound semiconductor of the first conductivity type extending above the semiconductor layer; and
   a gate electrode formed around the semiconductor nanowires in a connection portion between the semiconductor layer and the semiconductor nanowires,
   the semiconductor layer is made of gallium arsenide (GaAs) of the first conductivity type, and the semiconductor nanowires is made of a material containing indium arsenide (InAs) of the first conductivity type.

2. The semiconductor device according to claim 1, wherein an insulating film is formed over the semiconductor layer and around the semiconductor nanowires, and the gate electrode is formed over the insulating film.

3. The semiconductor device according to claim 1, wherein one of a source electrode or a drain electrode is formed over the semiconductor layer, and the other is connected to an upper end of the semiconductor nanowires.

4. The semiconductor device according to claim 1, wherein the gate electrode is provided for each of the semiconductor nanowires.

5. The semiconductor device according to claim 1, wherein the semiconductor nanowires have different diameters.

6. The semiconductor device according to claim 1, wherein a number of the semiconductor nanowires is 30 or more.

7. A method of manufacturing a semiconductor device, comprising:
   forming, over a substrate made of a compound semiconductor, a semiconductor layer and an insulating film by sequentially laminating the semiconductor layer and the insulating film;
   forming an opening in the insulating film and forming a plurality of catalyst layers over the semiconductor layer in the opening;
   forming a plurality of semiconductor nanowires by supplying a gas containing one element of a compound semiconductor included in the semiconductor nanowires and a gas containing another element of the compound semiconductor to allow the compound semiconductor to grow in a region where the catalyst layers are formed; and
   forming a gate electrode around the semiconductor nanowires in a connection portion between the semiconductor layer and the semiconductor nanowires,
   the semiconductor layer is made of gallium arsenide (GaAs) of the first conductivity type, and the semiconductor nanowires is made of a material containing indium arsenide (InAs) of the first conductivity type.

8. The method according to claim 7, further comprising:
   forming an insulating film around a side surface of the semiconductor nanowires, wherein the gate electrode around the semiconductor nanowires is formed via the insulating film.

9. The method according to claim 7, further comprising:
   forming, over the semiconductor layer, one of a source electrode a drain electrode; and
   forming, over an upper end of the semiconductor nanowires, the other of the source electrode or the drain electrode.

* * * * *